United States Patent
Breedy

(10) Patent No.: US 11,832,414 B2
(45) Date of Patent: Nov. 28, 2023

(54) POWER DISTRIBUTION POWERLINE NETWORKING MANAGEMENT SYSTEM

(71) Applicant: Dell Products L.P., Round Rock, TX (US)

(72) Inventor: Andrew Breedy, Mitchelstown (IE)

(73) Assignee: Dell Products L.P., Round Rock, TX (US)

( * ) Notice: Subject to any disclaimer, the term of this patent is extended or adjusted under 35 U.S.C. 154(b) by 199 days.

(21) Appl. No.: 16/985,309

(22) Filed: Aug. 5, 2020

(65) Prior Publication Data

US 2022/0046816 A1 Feb. 10, 2022

(51) Int. Cl.
*H05K 7/14* (2006.01)
*G06F 1/18* (2006.01)
*G06F 1/26* (2006.01)
*H04L 41/0226* (2022.01)

(52) U.S. Cl.
CPC ........... *H05K 7/1492* (2013.01); *G06F 1/189* (2013.01); *G06F 1/26* (2013.01); *H04L 41/0226* (2013.01)

(58) Field of Classification Search
CPC ....... H04L 41/0226; G06F 1/26; G06F 1/189; H05K 7/1492
USPC .......................................................... 700/295
See application file for complete search history.

(56) References Cited

U.S. PATENT DOCUMENTS

| | | | |
|---|---|---|---|
| 6,404,773 B1 * | 6/2002 | Williams | H04B 3/542 340/12.32 |
| 7,173,821 B2 * | 2/2007 | Coglitore | H05K 7/1492 361/698 |
| 7,194,528 B1 | 3/2007 | Davidow | |
| 7,598,625 B2 * | 10/2009 | Yu | H02J 13/00007 340/12.15 |
| 7,851,950 B1 * | 12/2010 | Morales | H05K 7/1492 307/147 |
| 8,674,823 B1 | 3/2014 | Contario et al. | |
| 2004/0128562 A1 | 7/2004 | Bigelow et al. | |
| 2008/0082842 A1 * | 4/2008 | Minami | G06F 1/26 713/300 |
| 2009/0217073 A1 * | 8/2009 | Brech | G06F 1/28 713/340 |

(Continued)

*Primary Examiner* — Mohamed A. Wasel
*Assistant Examiner* — John Fan
(74) *Attorney, Agent, or Firm* — Joseph Mencher

(57) ABSTRACT

A power distribution powerline networking management system includes a server rack. Each server device in the server rack includes a management subsystem, a power system th coupled to the management subsystem, and a server powerline networking engine that is included in the power system and that converts between dataline management communications and powerline management communications. A power distribution system is located in the server rack and includes a respective power connector coupled to the power system in each of the server devices, a respective power distribution powerline networking engine that is coupled to each respective power connector and that coverts between dataline management communications and powerline management communications, and a switching subsystem that is coupled to each respective power distribution powerline networking engine and that transmits dataline management communications between the power distribution powerline networking engines and a management system via a network.

20 Claims, 13 Drawing Sheets

(56) References Cited

U.S. PATENT DOCUMENTS

| | | | |
|---|---|---|---|
| 2014/0018969 A1* | 1/2014 | Forbes, Jr. | G05B 15/02 |
| | | | 700/295 |
| 2016/0302321 A1* | 10/2016 | Bratcher | H05K 7/026 |
| 2017/0302462 A1 | 10/2017 | Yun et al. | |
| 2017/0302508 A1 | 10/2017 | Kim et al. | |
| 2018/0294610 A1* | 10/2018 | Lewis | H01R 27/02 |
| 2018/0331854 A1 | 11/2018 | Nickel | |
| 2020/0221601 A1 | 7/2020 | Byers et al. | |

\* cited by examiner

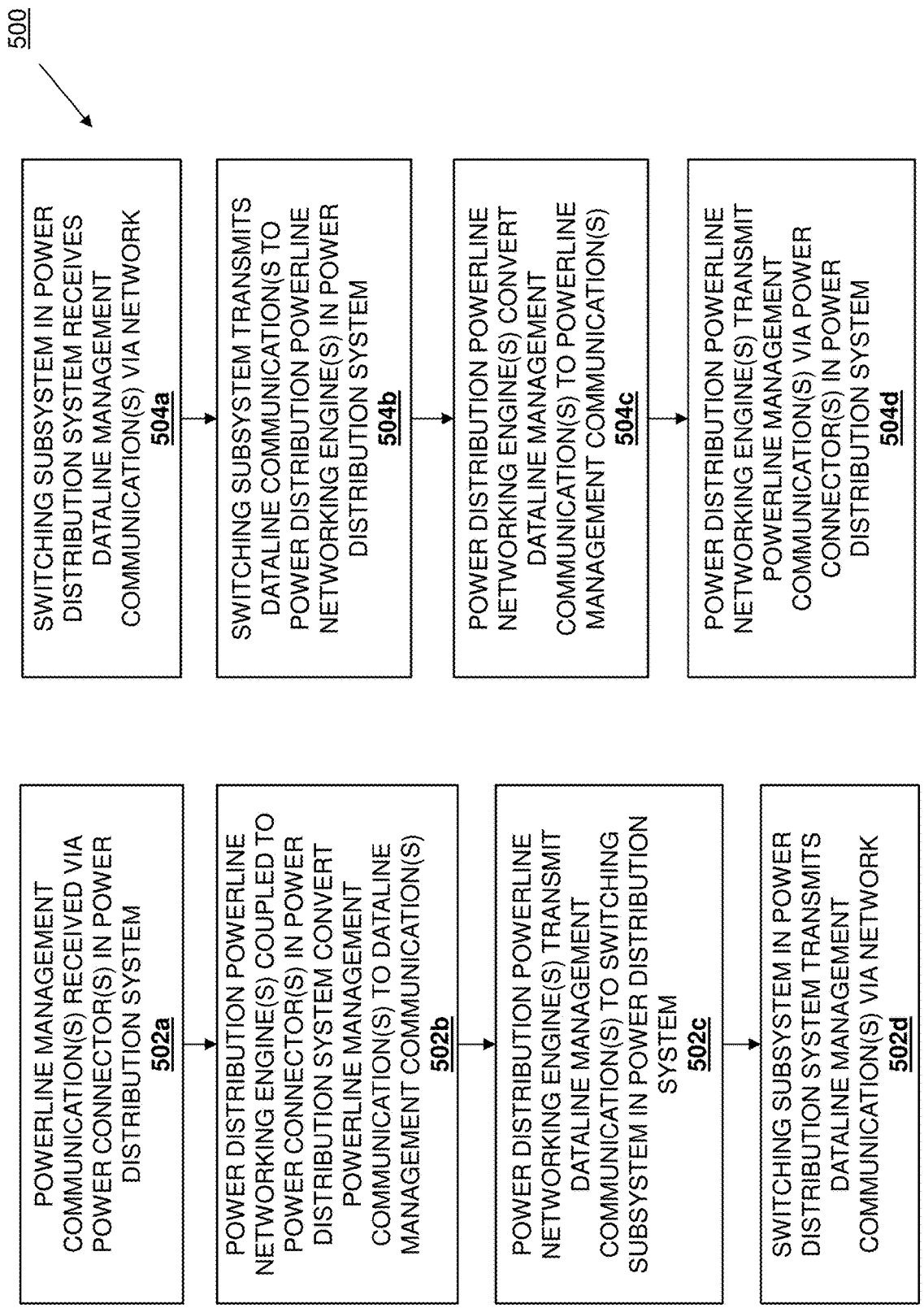

POWER DISTRIBUTION POWERLINE NETWORKING MANAGEMENT SYSTEM

BACKGROUND

The present disclosure relates generally to information handling systems, and more particularly to managing information handling systems via powerline networking functionality in a power distribution system.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server computing devices and/or other computing devices known in the art, are sometimes provided in server racks that house and support multiple server computing devices. Furthermore, each of those server computing devices may include a dedicated management subsystem such as, for example, the integrated DELL® Remote Access Controller (iDRAC) available in server computing devices provided by DELL® Inc. of Round Rock, Texas, United States. In such systems, each server computing devices requires power cabling that connects that server computing device to a power distribution system in the server rack, with the power distribution system operating to distribute power from a power source to each of the server computing devices. Furthermore, each server devices also requires management network cabling that connects that server computing device to a management switch device (e.g., a dedicated management Top Of Rack (TOR) switch device) in the server rack, with that management switch device further coupled to a management network in order to allow for management of each of the server computing devices through the management network via their respective management subsystems. As will be appreciated by one of skill in the art in possession of the present disclosure, the need to provide separate power cabling and management network cabling for each server computing device in the server rack (as well a data network cabling between each server computing device and data switch device(s) in the server rack) results in a wide variety of cable routing issues, rack/server access issues, and/or other issues that arise from the relatively large number of cables required in the server rack.

Accordingly, it would be desirable to provide a network management system that addresses the issues discussed above.

SUMMARY

According to one embodiment, a power distribution system includes a chassis; a plurality of power connectors that are located in the chassis and that are each configured to couple to a respective computing device; a respective power distribution powerline networking engine that is located in the chassis and coupled to each of the plurality of power connectors, wherein each respective power distribution powerline networking engine is configured to covert between dataline management communications and powerline management communications; and a switching subsystem that is located in the chassis and coupled to each respective power distribution powerline networking engine, wherein the switching subsystem is configured to transmit dataline management communications between the power distribution powerline networking engines and a management system via a network.

BRIEF DESCRIPTION OF THE DRAWINGS

FIG. 1 is a schematic view illustrating an embodiment of an Information Handling System (IHS).

FIG. 2 is a schematic view illustrating an embodiment of a power distribution powerline networking management system.

FIG. 3 is a schematic view illustrating an embodiment of a server device that may be provided in the power distribution powerline networking management system of FIG. 2.

FIG. 4 is a schematic view illustrating an embodiment of a power distribution system that may be provided in the power distribution powerline networking management system of FIG. 2.

FIG. 5 is a flow chart illustrating an embodiment of a method for power distribution powerline networking management.

FIG. 6A is a schematic view illustrating an embodiment of the server device of FIG. 3 operating during the method of FIG. 5.

FIG. 6B is a schematic view illustrating an embodiment of the power distribution powerline networking management system of FIG. 2 operating during the method of FIG. 5.

FIG. 6C is a schematic view illustrating an embodiment of the power distribution system of FIG. 4 operating during the method of FIG. 5.

FIG. 6D is a schematic view illustrating an embodiment of the power distribution powerline networking management system of FIG. 2 operating during the method of FIG. 5.

FIG. 7A is a schematic view illustrating an embodiment of the power distribution powerline networking management system of FIG. 2 operating during the method of FIG. 5.

FIG. 7B is a schematic view illustrating an embodiment of the power distribution system of FIG. 4 operating during the method of FIG. 5.

FIG. 7C is a schematic view illustrating an embodiment of the power distribution powerline networking management system of FIG. 2 operating during the method of FIG. 5.

FIG. 7D is a schematic view illustrating an embodiment of the server device of FIG. 3 operating during the method of FIG. 5.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
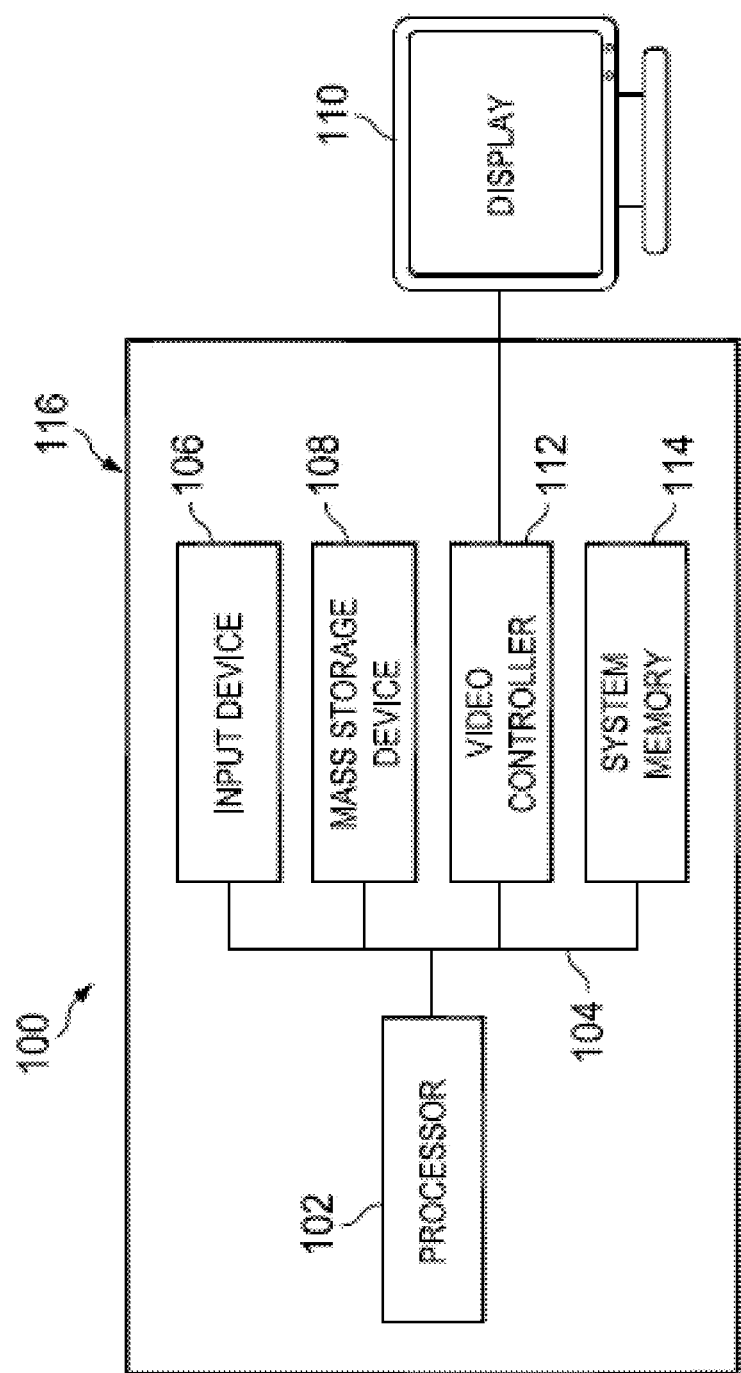

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety of other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
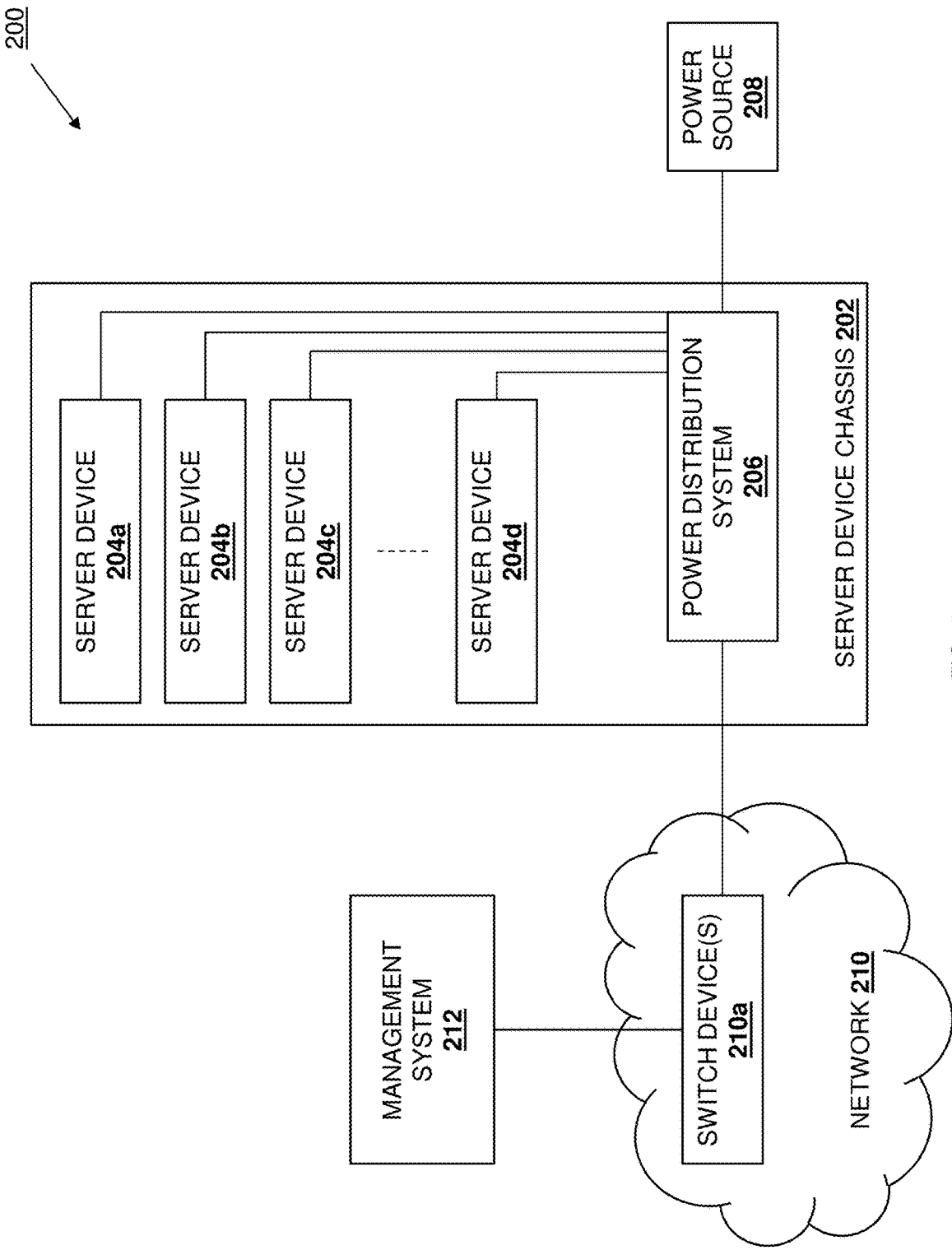

Referring now to FIG. 2, an embodiment of a power distribution powerline networking management system 200 is illustrated. In the illustrated embodiment, the power distribution powerline networking management system 200 includes a device chassis that is illustrated in FIG. 2 as a server device chassis 202 that may be provided by a server rack and/or other device chassis known in the art. Furthermore, the device chassis may house a plurality of devices, with the server device chassis 202 housing a plurality of server devices 204*a*, 240*b*, 204*c*, and up to 204*d*. In an embodiment, any or all of the server devices 204*a*-204*d* may be provided by the IHS 100 discussed above with reference to FIG. 1, and/or may include some or all of the components of the IHS 100. However, while illustrated and discussed as being provided by server devices, one of skill in the art in possession of the present disclosure will recognize that devices provided in the device chassis included in the power distribution powerline networking management system 200 may include storage controller devices, and/or any other devices that may be configured to operate similarly as the server devices 202*a*-202*d* discussed below.

In the illustrated embodiment, the server device chassis 202 also houses a power distribution system 206 that is coupled to each of the server devices 204*a*-204*d*. For example, in the embodiments discussed below, the power distribution system 206 is illustrated and described as a "power strip" that provides a plurality of Alternating Current (AC) power plug receptacle connectors that may connect to respective AC power plugs on respective AC power cabling that extends between each server device 204*a*-204*d* and the power distribution system 206. As such, each of the server devices 204*a*-204*d* may "plug into" the power distribution system 202 via conventional power cabling. However, while specific couplings between the server devices 204*a*-204*d* and the power distribution system 206 are illustrated and described herein, one of skill in the art in possession of the present disclosure will appreciate that other power couplings and/or power distribution systems will fall within the scope of the present disclosure as well.

As illustrated in FIG. 2, the power distribution system 206 may also be coupled to a power source 208. For example, AC power cabling may be provided between the power distribution system 206 and a wall outlet that provides the power source 208, and may operate to provide power to the power distribution system 206 so that the power distribution system 206 may provide that power to the server devices 204*a*-204*d* as discussed below. However, while a specific power source is described, one of skill in the art in possession of the present disclosure will recognize that a variety of power sources will fall within the scope of the present disclosure as well. As also illustrated in FIG. 2, the power distribution system 206 is also coupled to one or more switch devices 210*a* that provide a network 210. For example, as discussed below, a data coupling such as Ethernet cabling may be provided between the power distribution system 206 and a core switch device that is included in the switch device(s) 210*a* that provide the network 210. However, while a specific connection between the power distribution system 206 and the switch device(s) 210*a* is described, one of skill in the art in possession of the present disclosure will recognize that a variety of couplings will fall within the scope of the present disclosure as well.

As illustrated in FIG. 2, a management system 212 may be coupled to one of the switch device(s) 210*a* that provide the network 210, and may be provided by the IHS 100 discussed above with reference to FIG. 1, and/or may include some or all of the components of the IHS 100, and in specific examples may be provided by one or more management server devices that are configured to perform management operations for the server devices 204*a*-204*d*. However, while illustrated and discussed as being provided by management server devices, one of skill in the art in possession of the present disclosure will recognize that the management system 212 may be provided by a variety of other devices that may be configured to operate similarly as the management system 212 discussed below. Furthermore, while a specific power distribution powerline networking management system 200 has been illustrated and described, one of skill in the art in possession of the present disclosure will recognize that the power distribution powerline networking management system of the present disclosure may include a variety of components and component configurations while remaining within the scope of the present disclosure as well.

Figure 3:
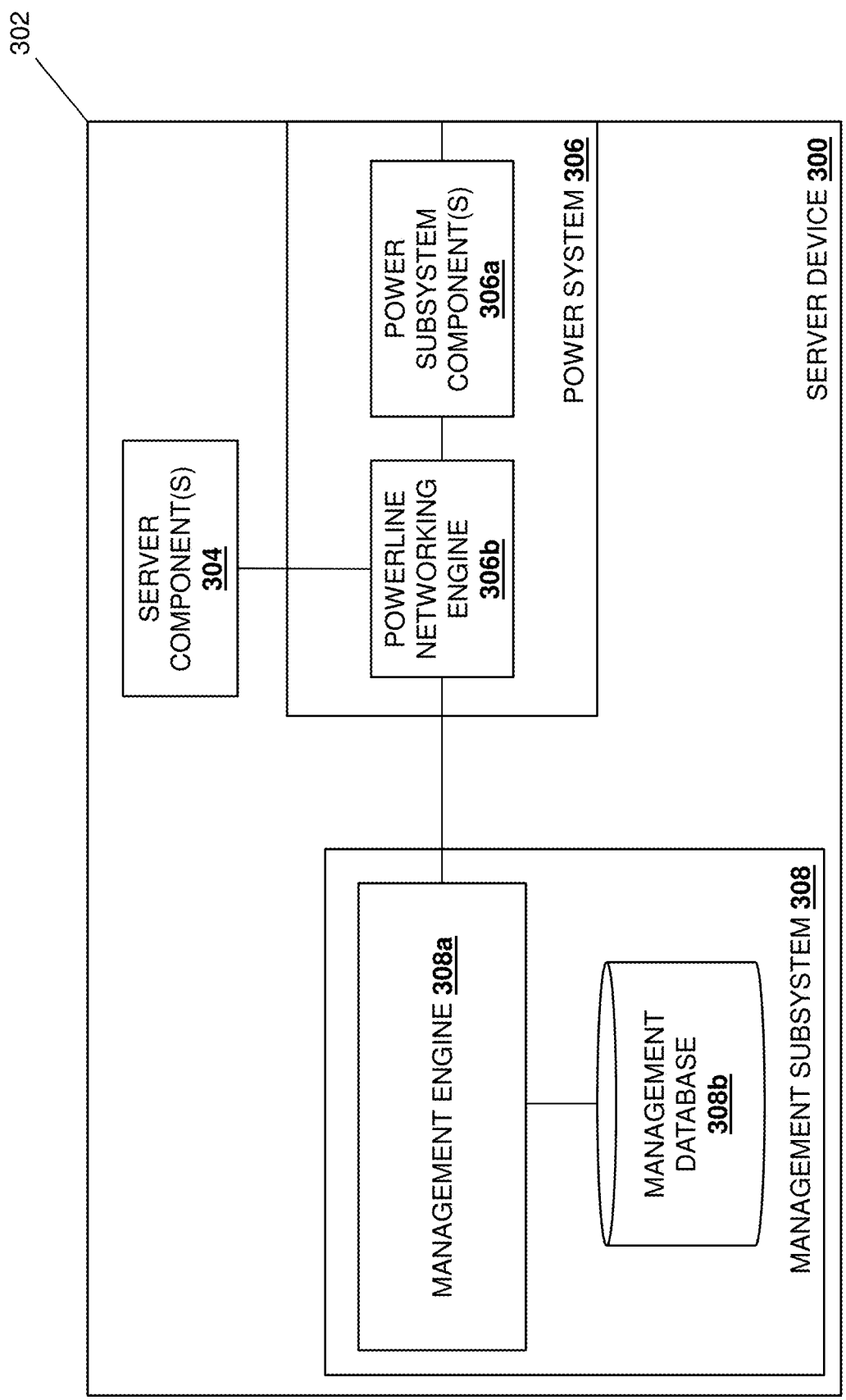

Referring now to FIG. 3, an embodiment of a server device 300 is illustrated that may provide any or all of the server devices 204a-204d discussed above with reference to FIG. 2. As such, the server device 300 may be provided by the IHS 100 discussed above with reference to FIG. 1 and/or may include some or all of the components of the IHS 100. However, while illustrated and discussed as being provided by a server device, one of skill in the art in possession of the present disclosure will recognize that the functionality of the server device 300 discussed below may be provided by storage controller devices and/or other devices that are configured to operate similarly as the server device 300 discussed below. In the illustrated embodiment, the server device 300 includes a chassis 302 that houses the components of the server device 300, only some of which are illustrated below. For example, the chassis 302 may house one or more server components 304 such as, for example, a processing system (not illustrated, but which may include the processor 102 discussed above with reference to FIG. 1) and a memory system (not illustrated, but which may include the memory 114 discussed above with reference to FIG. 1) that is coupled to the processing system and that includes instructions that, when executed by the processing system, cause the processing system to perform any of a variety of server functionality that would be apparent to one of skill in the art in possession of the present disclosure.

As illustrated in FIG. 3, the chassis 302 may also house a power system 306 such as, for example, a Power Supply Unit (PSU) and/or any other power system that would be apparent to one of skill in the art in possession of the present disclosure. In the illustrated embodiment, the power system 306 includes one or more power subsystem components 306a that may include a power system connector that is configured to connect the power system 306 in the server device 300 to the power distribution system 206 discussed above with reference to FIG. 2 (e.g., via the AC power cabling discussed above), power conversion components that are configured to convert power received from the power distribution system 206, and/or any other power subsystem components that would be apparent to one of skill in the art in possession of the present disclosure.

Furthermore, the power system 306 may also include a powerline networking processing system (not illustrated, but which may include the processor 102 discussed above with reference to FIG. 1) and a powerline networking memory system (not illustrated, but which may include the memory 114 discussed above with reference to FIG. 1) that is coupled to the powerline networking processing system and that includes instructions that, when executed by the powerline networking processing system, cause the powerline networking processing system to provide a powerline networking engine 306b that is coupled to the power subsystem component(s) 306a in order to perform the functionality of the server powerline networking engines and/or server devices discussed below. In a specific example, the powerline networking engine 306a may be provided on a circuit board that is included in the PSU provided in the server device 300, although one of skill in the art in possession of the present disclosure will recognize that other powerline networking engine configurations will fall within the scope of the present disclosure as well.

In the illustrated embodiment, the chassis 302 also houses a management subsystem 308 that is coupled to the powerline networking engine 306b in the power system 306, and that may be provided by, for example, a remote access controller system such as the integrated DELL® Remote Access Controller (iDRAC) available from the DELL® Inc. of Round Rock, Texas, United States, a Baseboard Management Controller (BMC), and/or other management subsystems known in the art. For example, the management subsystem 308 may include a management processing system (not illustrated, but which may include the processor 102 discussed above with reference to FIG. 1) and a management memory system (not illustrated, but which may include the memory 114 discussed above with reference to FIG. 1) that is coupled to the management processing system and that includes instructions that, when executed by the management processing system, cause the management processing system to provide a management engine 308a that is coupled to the powerline networking engine 306b in the power system 306, and that is configured to perform the functionality of the management engines and/or management subsystems discussed below.

Furthermore, the management subsystem 308 may also include a storage system (not illustrated, but which may be provided by the storage device 108 discussed above with reference to FIG. 1) that provides a management database 308b that is coupled to the management engine 308a (e.g., via a coupling between the management processing system and the storage system) and that is configured to store any information utilized by the management engine 308a. However, while a specific server device 300 has been illustrated, one of skill in the art in possession of the present disclosure will recognize that server devices (or other devices operating according to the teachings of the present disclosure in a manner similar to that described below for the server device 300) may include a variety of components and/or component configurations for providing conventional server device functionality, as well as the functionality discussed below, while remaining within the scope of the present disclosure as well.

Figure 4:
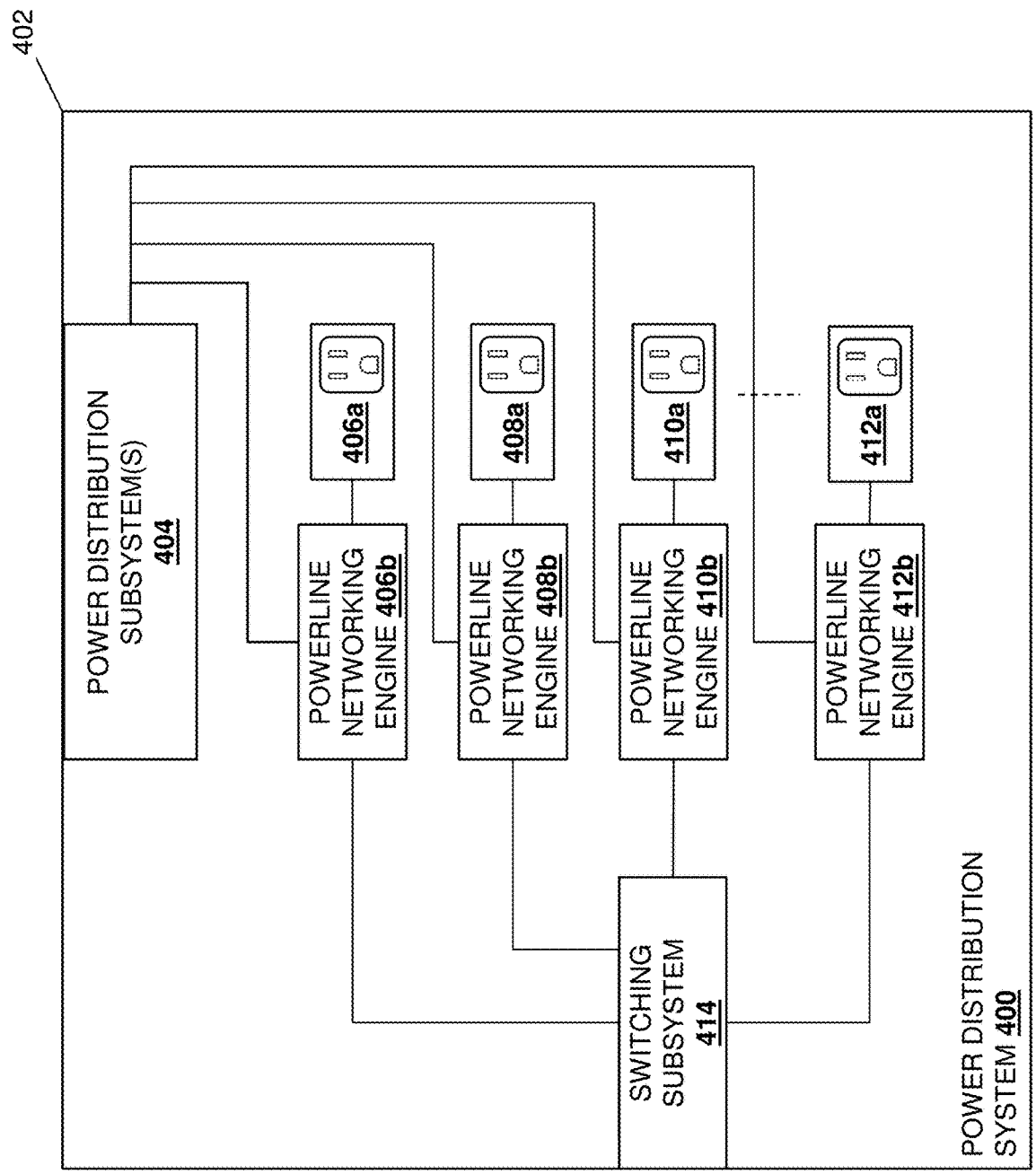

Referring now to FIG. 4, an embodiment of a power distribution system 400 is illustrated that may provide the power distribution system 206 discussed above with reference to FIG. 2. As such, the power distribution system 400 may be provided by a Power Distribution Unit (PDU) and/or using a variety of power distribution components known in the art. In the illustrated embodiment, the power distribution system 400 includes a chassis 402 that houses the components of the power distribution system 400, only some of which are illustrated below. For example, the chassis 402 may house one or more power distribution components 404 that one of skill in the art in possession of the present disclosure would recognize as allowing the power distribution system 400 to receive power from the power source 208, and/or perform any of the power distribution functionality discussed below. Furthermore, as illustrated in FIG. 4, the chassis 402 also houses a plurality of power connectors 406a, 408a, 410a, and up to 412a. One of skill in the art in possession of the present disclosure will recognize that the power connectors 406a, 408a, 410a, and up to 412a are illustrated and described as being provided by AC power plug receptacles, but may be provided by other power connectors and/or couplings while remaining within the scope of the present disclosure as well.

In the illustrated embodiment, a respective powerline networking engine 406b, 408b, 410b, and up to 412b is provided with each power connector 406a, 408a, 410a, and up to 412a, respectively, and each powerline networking engine 406b, 408b, 410b, and up to 412b may be coupled to the power distribution subsystem(s) 404 as well. In an embodiment, each of the powerline networking engine 406b, 408b, 410b, and up to 412b may be provided by a powerline networking processing system (not illustrated, but which may include the processor 102 discussed above with reference to FIG. 1) and a powerline networking memory system (not illustrated, but which may include the memory 114 discussed above with reference to FIG. 1) that is coupled to the powerline networking processing system and that includes instructions that, when executed by the powerline networking processing system, cause the powerline networking processing system to provide that powerline networking engine that is configured to perform the functionality of the power distribution powerline networking engines and/or power distribution systems discussed below. In a specific example, each powerline networking engine 406b, 408b, 410b, and up to 412b may be provided on a circuit board that is connected to the power connector 406a, 408a, 410a, and up to 412a, respectively, although one of skill in the art in possession of the present disclosure will recognize that other powerline networking engine configurations will fall within the scope of the present disclosure as well. For example, in some embodiments, a powerline networking engine may be provided for multiple power connectors (e.g., a powerline networking engine may be provided for more than two, and up to all, of the power connectors 406a, 408a, 410a, and up to 412a.

In the illustrated embodiment, the chassis 402 also houses a switching subsystem 414 that is coupled to each of the powerline networking engines 406b, 408b, 410b, and up to 412b via, for example, traces on one or more circuit boards, cabling, and/or other coupling techniques known in the art. In a specific example, the switching subsystem 414 may be provided by an Ethernet management switch that is integrated in the chassis 402 of the power distribution system 400, but one of skill in the art in possession of the present disclosure will recognize that the functionality discussed below as being provided by the switching subsystem 414 may be provided by a variety of devices and/or subsystems while remaining within the scope of the present disclosure as well. However, while a specific power distribution system 400 has been illustrated, one of skill in the art in possession of the present disclosure will recognize that power distribution systems (or other devices operating according to the teachings of the present disclosure in a manner similar to that described below for the power distribution system 400) may include a variety of components and/or component configurations for providing conventional power distribution functionality, as well as the functionality discussed below, while remaining within the scope of the present disclosure as well.

Referring now to FIG. 5, an embodiment of a method 500 for power distribution powerline networking management is illustrated. As discussed below, the systems and methods of the present disclosure provide a power distribution system that includes a switching subsystem coupled to powerline networking engine(s) that are provided with its power connectors and that operate to convert between dataline management communications and powerline management communications, which allows the management subsystem in each of a plurality of server devices to perform management operations via the power cabling that couples those server devices to the power distribution system. For example, embodiments of the power distribution powerline networking management system of the present disclosure may include a plurality of server devices in server rack, with each of the server devices including a management subsystem, a power system coupled to the management subsystem, and a server powerline networking engine in the power system that is configured to convert between dataline management communications and powerline management communications. The server rack also includes a power distribution system having a respective power connector coupled to the power system in each of the plurality of server devices, a respective power distribution powerline networking engine that is coupled to each respective power connector and that is configured to covert between dataline management communications and powerline management communications, and a switching subsystem that is coupled to each respective power distribution powerline networking engine and that is configured to transmit dataline management communications between the power distribution powerline networking engines and a management system via a network. As such, dataline management communications generated by the server devices and a network-attached management system are converted by the power distribution system to powerline management communications that may be transmitted via power cabling, thus eliminating the need for management network cabling for each of the server devices in order to enable the performance of management operations.

As discussed below, the method 500 allows the for transmission of management communications from any of the server devices 204a-204d to the management system 212, and from the management system 212a to any of the server devices 204a-204d, and those management communication transmission may be provided at the same time. As such, the method 500 is described below as including blocks 502a-502d that describe the transmission of management communications from the server device 204a to the management system 212, and well as including blocks 504a-504d that describe the transmission of management communications from the management system 212 to the server device 204a, and one of skill in the art in possession of the present disclosure will recognize how the blocks 502a-502d and 504a-504d may be performed at the same (or different) times while remaining within the scope of the present disclosure Furthermore, the discussion of the transmission of management communications below focuses on the server device 204a, but one of skill in the art in possession of the present disclosure will appreciate that management communications may be transmitted between the management system 212 and any of the server devices 204b-204d while remaining within the scope of the present disclosure as well. The inventor of the present disclosure described techniques that may be utilized in the power distribution powerline networking management system of the present disclosure for remote server management using a power line network in U.S. patent application Ser. No. 16/867,550, filed on May 5, 2020, the disclosure of which is incorporated herein by reference in its entirety.

Figure 6A:
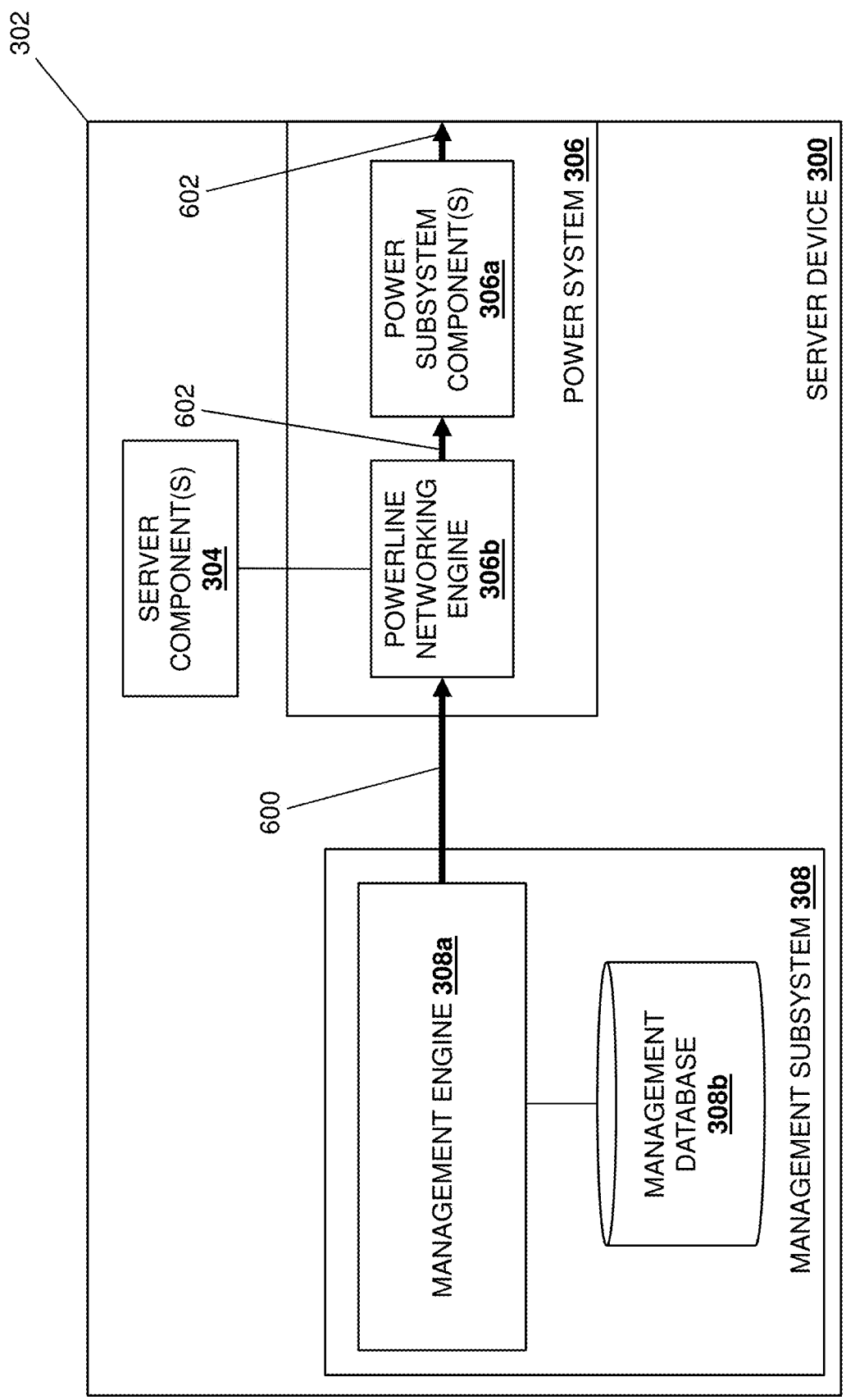

As such, in some embodiments, the method 500 may begin at block 502a where powerline management communication(s) are received via power connector(s) in a power distribution system. As will be appreciated by one of skill in the art in possession of the present disclosure, the management subsystem 308 in the server device 204a/300 may operate during the method 500 to generate management communications associated with the management of the server device 204a. For example, the management subsystem 308 may be provided by an iDRAC® in a server device provided by DELL® Inc. of Round Rock, Texas, United States, and may be configured to generate and transmit management communications that provide for the management of that server device via a network, and one of skill in the art in possession of the present disclosure will recognize that any of a variety of management communications known in the art may be generated at block 502a. With reference to FIG. 6A, in an embodiment of block 502a, the management engine 308a in the management subsystem 308 included in the server device 204a/300 may then perform dataline management communication transmission operations 600 that operate to transmit dataline management communication from the management engine 308a to the powerline networking engine 306b in the power system 306 included in the server device 204a/300. As will be appreciated by one of skill in the art in possession of the present disclosure, the dataline management communications generated and transmitted at block 502a may include Ethernet management communications, Fiber Channel management communications, iSCSI management communication, and/or management communications transmitted via any of a variety of other dataline communication technologies that would be apparent to one of skill in the art in possession of the present disclosure.

As such, at block 502a, the powerline networking engine 306b in the power system 306 included in the server device 204a/300 may operate to receive the dataline management communications from the management engine 308a and, in response, convert those dataline management communications to powerline management communications. As will be appreciated by one of skill in the art in possession of the present disclosure, the powerline management communications may configure the management communications generated by the management engine 308a for simultaneous transmission along with AC power via conductor(s) in power cabling that is connected to the power system 306 included in the server device 204a/300. As such, the powerline networking engine 306b may be configured to perform any of a variety of dataline/powerline communication conversion operations that one of skill in the art in possession of the present disclosure would recognize as providing for the transformation of any of a variety of dataline protocol communication data to powerline protocol communication data at block 502a. In a specific example, the powerline networking engine 306b may operate similarly as and/or according to the "Homeplug" standard promulgated by the HomePlug Power Alliance, which one of skill in the art in possession of the present disclosure will recognize defines conversion and transmission protocols for powerline networking operations, and includes transmitting powerline management signals and/or other data at a different frequency than the power transmissions (e.g., AC power signals).

Figure 6B:
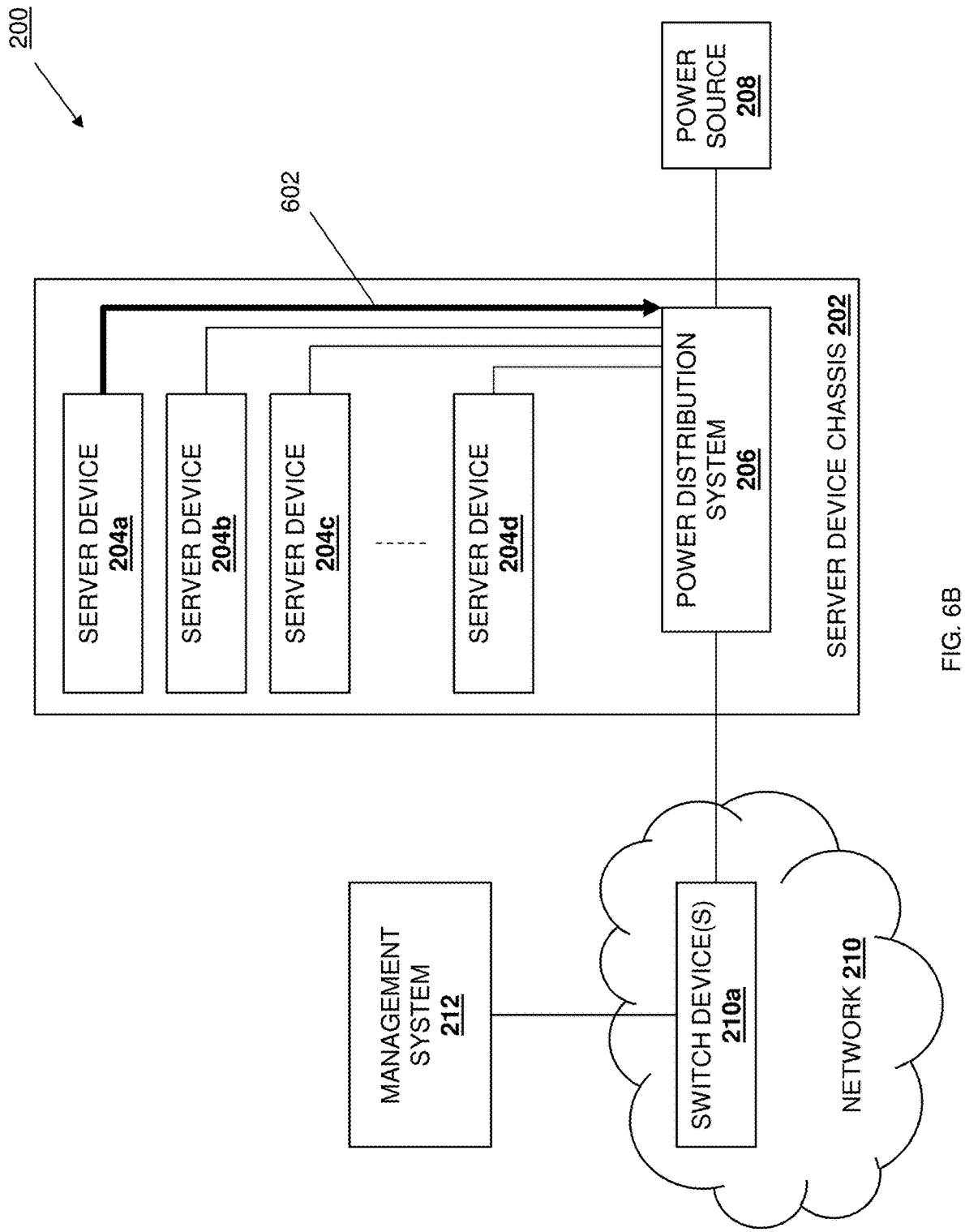

With continued reference to FIG. 6A, at block 502a and subsequent to converting the dataline management communications to powerline management communications, the powerline networking engine 306b may perform powerline management communication transmission operations 602 in order to transmit the powerline management communications out of the power system 306, which is illustrated in FIG. 6A as including the transmission of the powerline management communications via one or more of the power subsystem components 306a and out of the power system 306. With reference to FIG. 6B, the powerline management communication transmission operations 602 that operate to transmit the powerline management communications out of the power system 306 in the server device 204a/300 also operate to transmit the powerline management communications from the server device 204a to the power distribution system 206 via the power cabling that extends between the power system 306 on the server device 204a/300 (e.g., via an AC power cable that is connected to a power connector on the power system 306) and the power connector 406a on the power distribution system 206/400. Thus, at block 502a, the powerline management communications are received by the power distribution system 206/400 at the power connector 406a, and one of skill in the art in possession of the present disclosure will recognize that power management communications may be received at the power connectors 408a, 410a, and up to 412a in a similar manner from any of the server devices 204b-204d via the power cabling that connects those server devices to those power connectors.

Figure 6C:
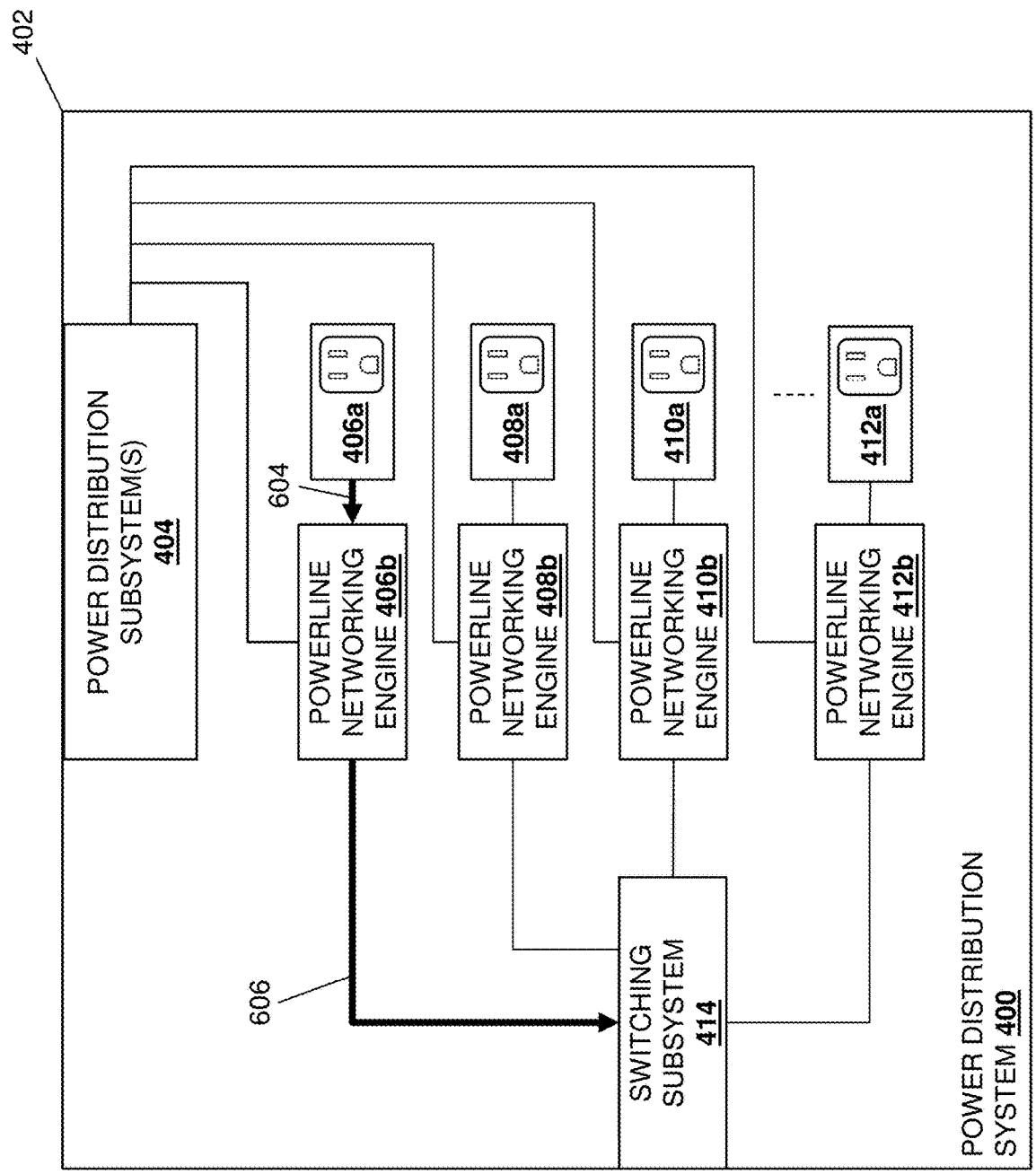

The method 500 may then proceed to block 502b where power distribution powerline networking engine(s) coupled to the power connector(s) in the power distribution system convert the powerline management communication(s) to dataline management communication(s). With reference to FIG. 6C, in an embodiment of block 502b, the power connector 406a in the power distribution system 206/400 may perform powerline management communication transmission operations 604 that operate to provide the powerline management communications received at block 502a to the powerline networking engine 406a, and one of skill in the art in possession of the present disclosure will appreciate how any of the power connectors 408a, 410a, and up to 412a may provide powerline management communications to their respective powerline networking engines 408b, 410b, and up to 412b in a similar manner while remaining within the scope of the present disclosure as well. As such, at block 502b, the powerline networking engine 406b in the power distribution system 206/400 may operate to receive the powerline management communications from the power connector 406a and, in response, convert those powerline management communications to dataline management communications.

As will be appreciated by one of skill in the art in possession of the present disclosure, the conversion operations performed at block 502b may convert the powerline management communications received during the transmission of AC power (e.g., via conductor(s) in power cabling that is connected to the power distribution system 206/400) to dataline management communication that are configured to be transmitted on network cabling (e.g., Ethernet cabling, Fiber Optic cabling, etc.). As such, the powerline networking engine 406b may be configured to perform any of a variety of dataline/powerline communication conversion operations that one of skill in the art in possession of the present disclosure would recognize as providing for the transformation of any of a variety of powerline protocol communication data to dataline protocol communication data at block 502b.

The method 500 may then proceed to block 502c where the power distribution powerline networking engine(s) transmit the dataline management communication(s) to a switching subsystem in the power distribution system. With reference to FIG. 6C, in an embodiment of block 502c, the powerline networking engine 406b in the power distribution system 206/400 may perform dataline management communication transmission operations 606 that operate to transmit the dataline management communications to the switching subsystem 414 in the power distribution system 206/400, and one of skill in the art in possession of the present disclosure will recognize how any of the powerline networking engines 408b, 410b, and 412b in the power distribution system 206/400 may perform similar dataline management communication transmission operations to transmit dataline management communications to the switching subsystem 414 in the power distribution system 206/400 in a similar manner while remaining within the scope of the present disclosure as well. As such, at block 502c, the switching subsystem 414 may receive the dataline management communications that were converted by the powerline networking engine 406b.

Figure 6D:
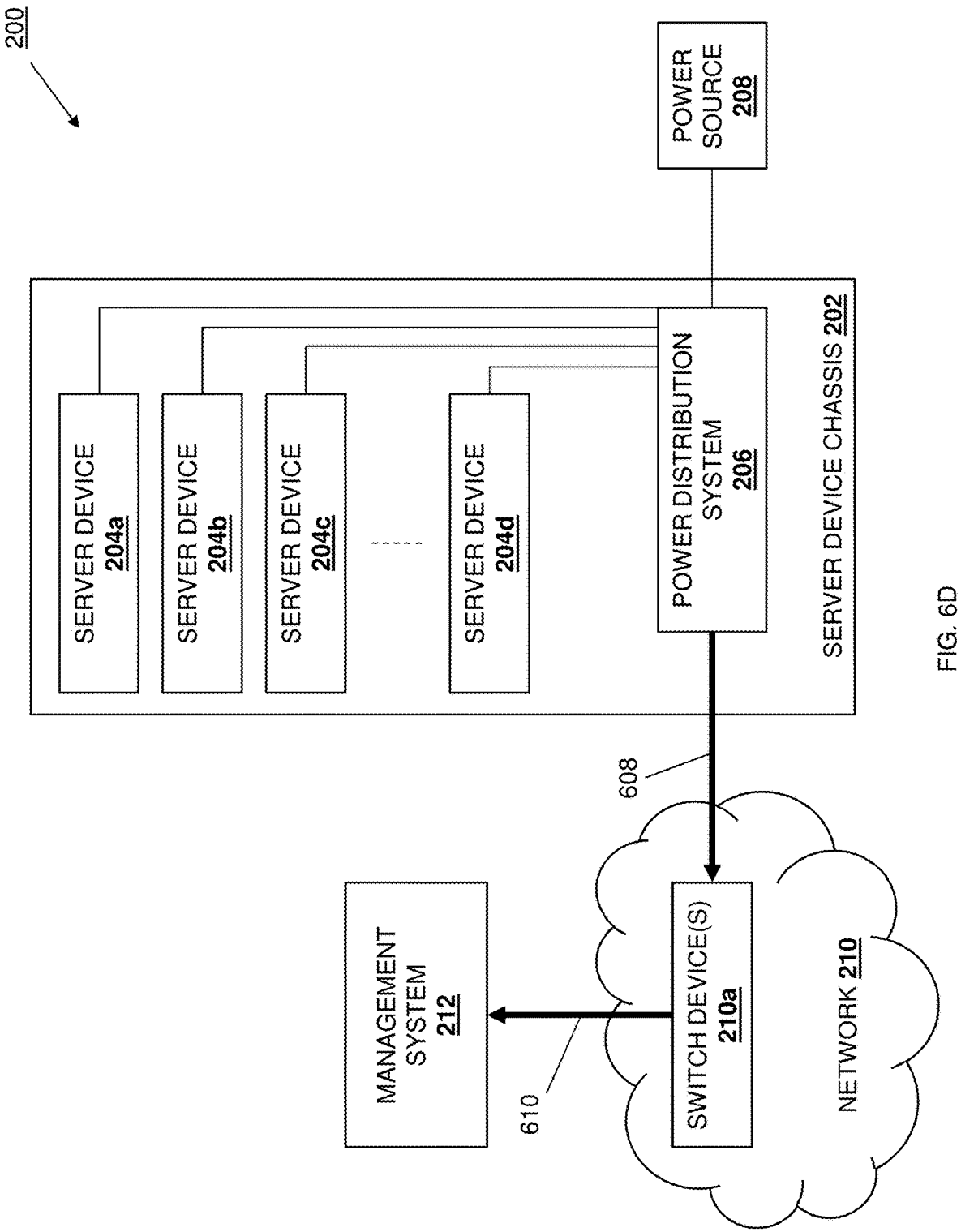

The method 500 may then proceed to block 502d where the switching subsystem in the power distribution system transmits the dataline management communication(s) via a network. With reference to FIG. 6D, in an embodiment of block 502d, the switching subsystem 414 in the power distribution system 206/400 may operate to perform dataline management communication transmission operations 608 that operate to transmit the dataline management communications converted at block 502c via the network 210 to the management system 212, which may include those dataline management communications being received by one or more switch devices 210a that provide the network 210, and those one or more switch devices 210a performing dataline management communication transmission operations 610 to transmit the dataline management communications to the management system 212. As such, one of skill in the art in possession of the present disclosure will appreciate how the dataline management communications converted by the switching subsystem 414 and transmitted via the network 210 to the management system 212 may include a variety of routing information that allow its transmission over the network to the management system 212 while remaining within the scope of the present disclosure. Furthermore, one of skill in the art in possession of the present disclosure will recognize how, in response to receiving the dataline management communications, the management system 212 may perform any of a variety of management operations (e.g., using those dataline management communications, in response to those dataline management communications, etc.) that will fall within the scope of the present disclosure.

Thus, the server device 204a (and any of the server devices 204b-204d) may transmit management communications to the management system 212 via power cabling (e.g., a single AC power cable extending between that server device and the power distribution system 206), eliminating the need for conventional management networking cabling that extends between the server device 204a and a management switch device in the server device chassis 202/server rack and that must conventionally be routed through the server device chassis 202/server rack, as well as allowing (in some embodiments) for the elimination of the management switch device from the server device chassis 202/server rack. As will be appreciated by one of skill in the art in possession of the present disclosure, providing for the elimination of such network cabling and management switch devices frees up space in the server device chassis 202/server rack that may reduce the size of the server device chassis 202/server rack and/or be used for other server devices.

As discussed above, that transmission of the management communications from the server devices 204a-204d to the management system 212 may be performed at the same (or a different) time as the transmission of management communications from the management system 212 to the server devices 204a-204d. As such, in some embodiments, the method 500 may begin at block 504a where the switching subsystem in the power distribution system receives dataline management communication(s) via the network. As will be appreciated by one of skill in the art in possession of the present disclosure, the management system 212 may operate during the method 500 to generate management communications associated with the management of the server device 204a. For example, the management system 212 may be configured to generate and transmit management communications to the iDRACs discussed above that may be included in server devices provided by DELL® Inc. of Round Rock, Texas, United States, which may provide for the management of those server device via a network, and thus any of a variety of management communications known in the art are envisioned as falling within the scope of the present disclosure.

As such, in an embodiment of block 504a, the management system 212 may generate dataline management communications, which as discussed above may include Ethernet management communications, Fiber Channel management communications, iSCSI management communication, and/or management communications transmitted via any of a variety of other dataline communication technologies that would be apparent to one of skill in the art in possession of the present disclosure. The management system 212 may then perform dataline management communication transmission operations 700 that operate to transmit the dataline management communications via the network 210 to the switching subsystem 414 in the power distribution system 206/400, which may include those dataline management communications being received by one or more switch devices 210a that provide the network 210, and those one or more switch devices 210a performing dataline management communication transmission operations 702 to transmit the dataline management communications to the switching subsystem 414 in the power distribution system 206/400. As such, one of skill in the art in possession of the present disclosure will appreciate how the dataline management communications generated by the management system 212 may include a variety of routing information that allow its transmission over the network 210 to the switching subsystem 414 in the power distribution system 206/400 while remaining within the scope of the present disclosure. As such, at block 504a, the switching subsystem 414 in the power distribution system 206/400 may receive the dataline management communications from the management system 212 via the network 210.

Figure 7A:
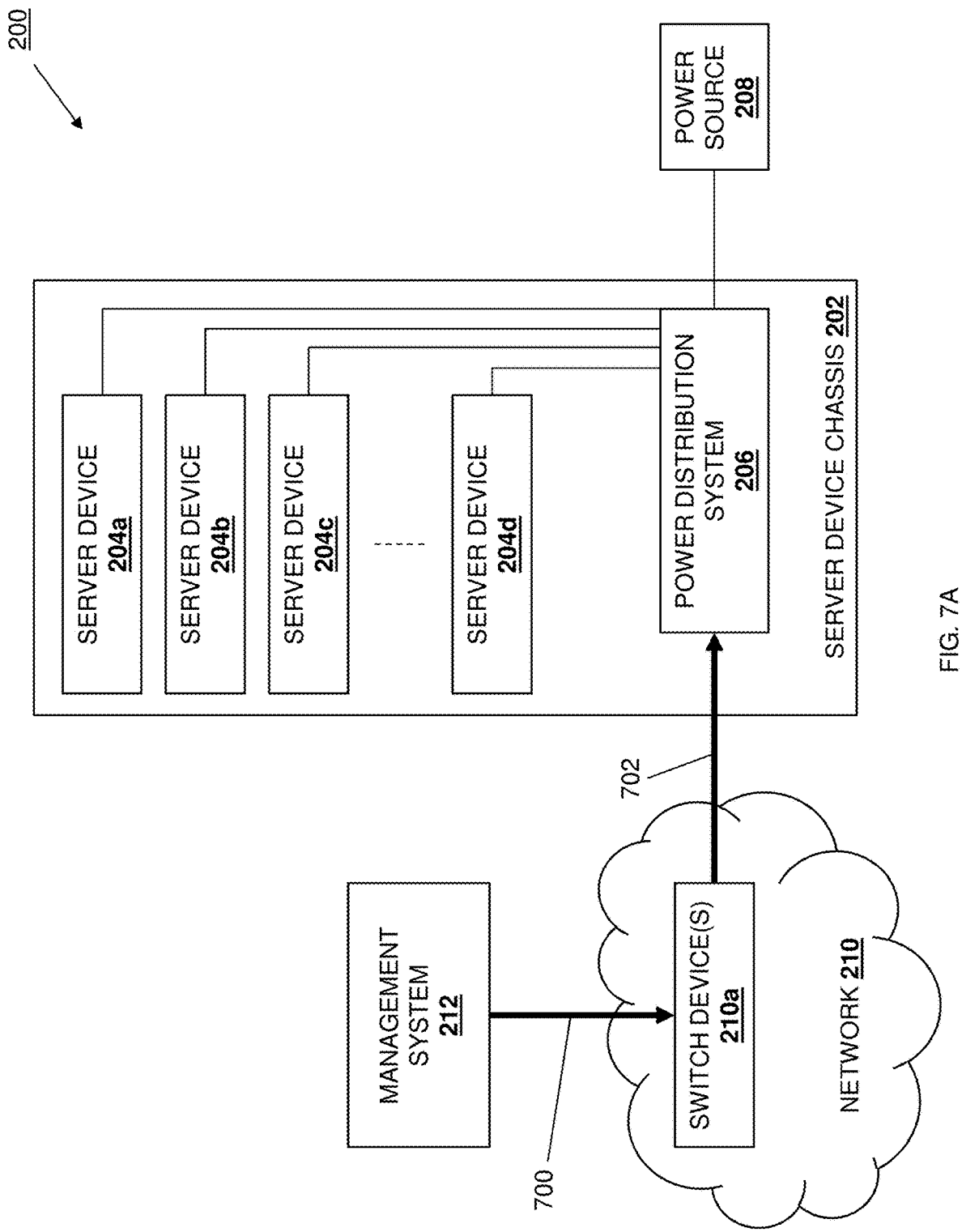
Figure 7B:
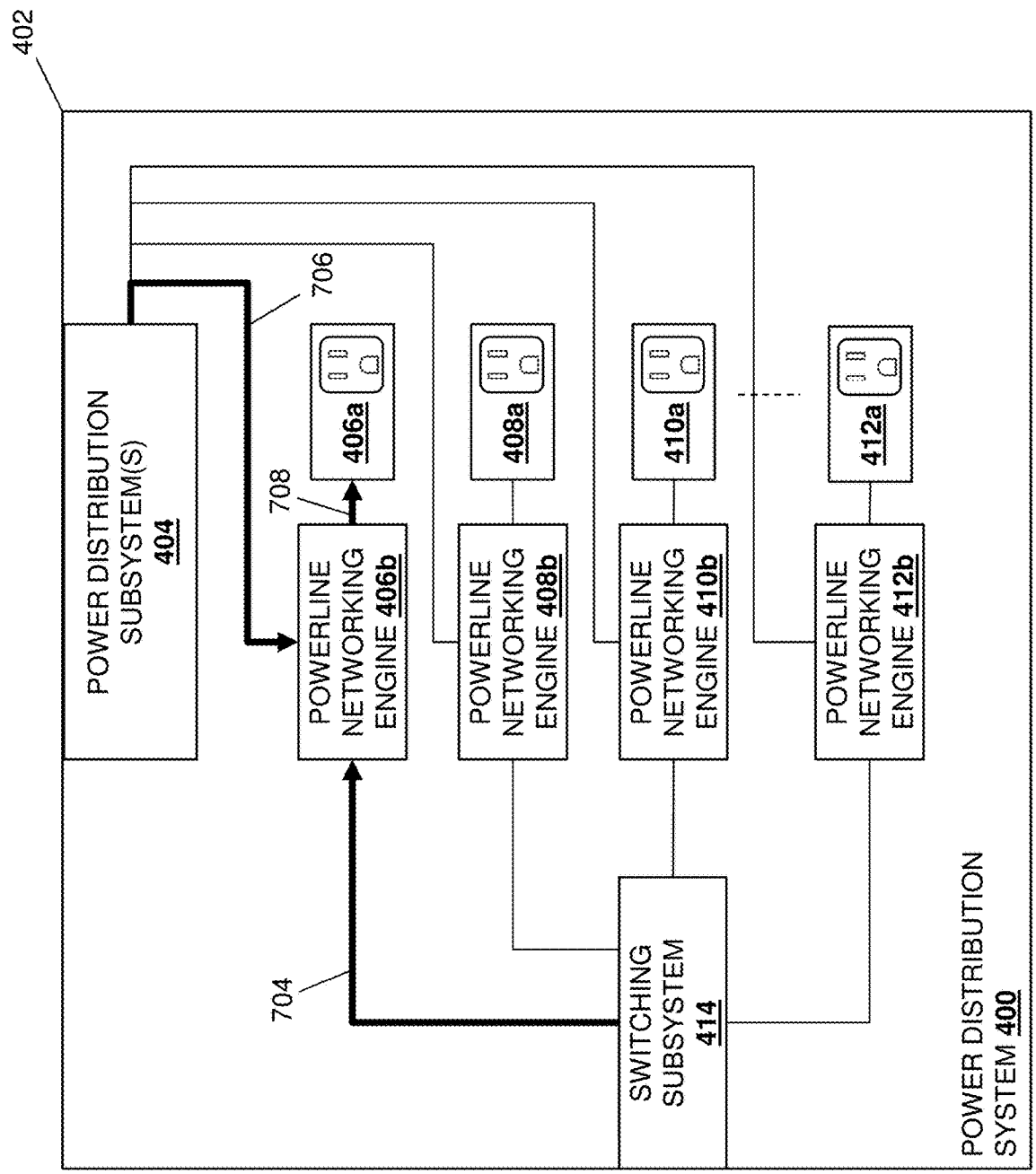

The method 500 may then proceed to block 504b where the switching subsystem in the power distribution system transmits the dataline management communication(s) to the power distribution powerline networking engine(s) in the power distribution system. With reference to FIG. 7B, in an embodiment of block 504b, the switching subsystem 414 in the power distribution system 206/400 may then perform dataline management communication transmission operations 704 that operate to transmit the dataline management communications received via the network 210 to the powerline networking engine 406b in the power distribution system 206/400. As discussed above, the dataline management communications received via the network 210 may include a variety of routing information that allow the switching subsystem 414 to identify the management subsystem 308 in the server device 204a/300 as the destination of those dataline management communication, and thus may operate to transmit those dataline management communications to the powerline networking engine 406b that is provided with the power connector 406a that is identified as being connected to that server device 204a via power cabling. Furthermore, one of skill in the art in possession of the present disclosure will appreciate how dataline communications destined for any of the server devices 204b-204d may be transmitted to the powerline networking engine provided with the power connector connected to those server devices in a similar manner as well. As such, at block 504b, the power networking engine 406b may receive the dataline management communications.

The method 500 may then proceed to block 504c where power distribution powerline networking engine(s) convert the dataline management communication(s) to powerline management communication(s). With reference to FIG. 7B, in an embodiment of block 504c, the powerline networking engine 406b in the power distribution system 206/400 may operate to receive the dataline management communications from the switching subsystem 414 and, in response, convert those dataline management communications to powerline management communications. As will be appreciated by one of skill in the art in possession of the present disclosure, the conversion operations performed at block 504c may convert the dataline management communications received from the switching subsystem 414 to powerline management communications that may then be transmitted, along with AC power 706 received via the power distribution subsystem(s) 404 from the power source 208, via conductor(s) in power cabling that is connected to the power connector 406a on the power distribution system 206/400. As such, the powerline networking engine 406b may be configured to perform any of a variety of dataline/powerline communication conversion operations that one of skill in the art in possession of the present disclosure would recognize as providing for the transformation of any of a variety of dataline protocol communication data to powerline protocol communication data at block 504c.

The method 500 may then proceed to block 504d where power distribution powerline networking engine(s) transmit the powerline management communication(s) via the power connector(s) in the power distribution system. With continued reference to FIG. 7B, in an embodiment of block 504d, the powerline networking engine 406b in the power distribution system 206/400 may perform powerline management communication transmission operations 708 in order to transmit the powerline management communications converted at block 504c along with the AC power 706 to the power connector 406c, and one of skill in the art in possession of the present disclosure will recognize how any of the powerline networking engines 408b, 410b, and up to 412b may operate to convert dataline management communications to powerline management communications, receive AC power, and transmits the powerline management communications along with AC power via their respective power connectors 408a, 410a, and up to 412a while remaining within the scope of the present disclosure as well.

Figure 7C:
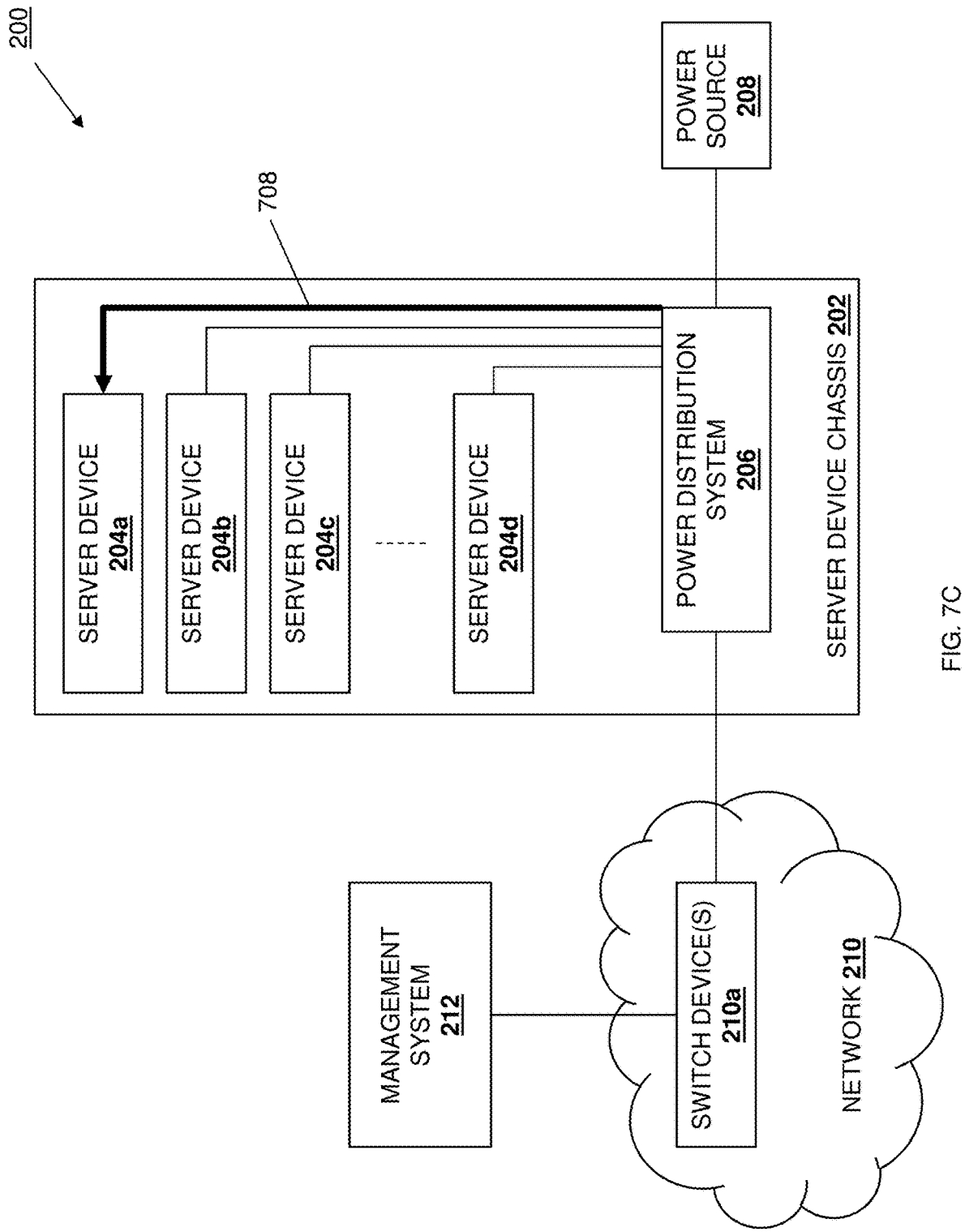

With reference to FIG. 7C, at block 504d, the powerline management communication transmission operations 708 that transmit the powerline management communications along with AC power 706 out of the power connector 406a in the power distribution system 206/300 also operate to transmit the powerline management communications along with AC power 706 to the server device 204a via the power cabling that extends between the power connector 406a on the power distribution system 206/400 (e.g., an AC power cable that is connected to the power connector 406a), and the power system 306 on the server device 204a/300. Thus, at block 504d, the powerline management communications are received by the power system 306 in the server device 204a/300.

Figure 7D:
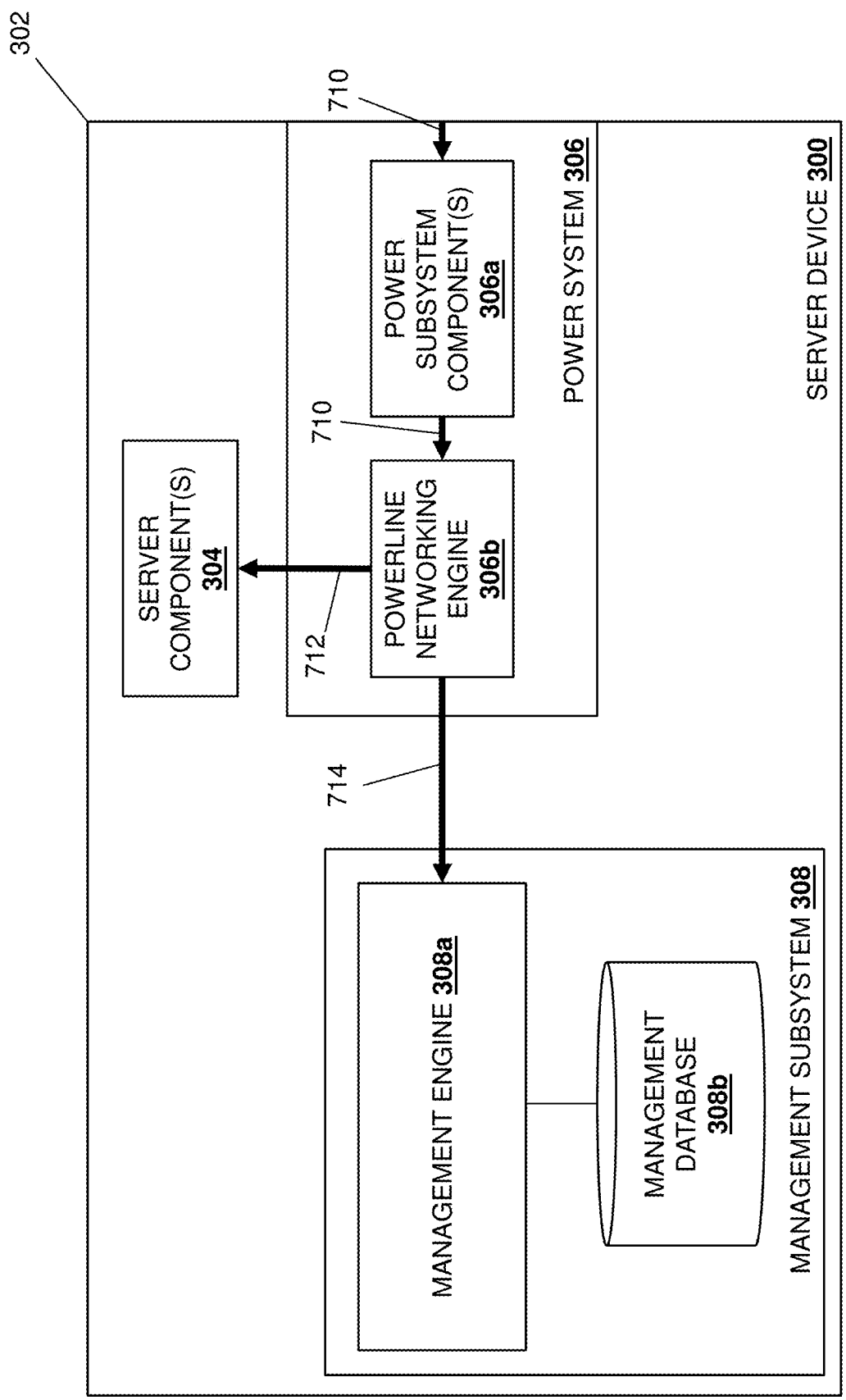

As illustrated in FIG. 7D, in an embodiment of block 504d, the power system 306 in the server device 204a/300 may perform powerline management communications transmission operations 710 that operate to transmit the powerline management communications received by the power system 306 via the one or more power subsystem components 306a to the power networking engine 306b in the power system 306 included in the server device 204a/300.

As such, in an embodiment, the powerline networking engine 306b may receive the powerline management communications and AC power and, in response, may operate to convert those powerline management communications to dataline management communications. As will be appreciated by one of skill in the art in possession of the present disclosure, the conversion operations performed at block 504d may convert the powerline management communications (received along with the AC power via conductor(s) in power cabling that is connected to the power system 306 in the server device 204a/300) to dataline management communication that are configured to be transmitted on network cabling (e.g., Ethernet cabling, Fiber Optical cabling, etc.). As such, the powerline networking engine 306b may be configured to perform any of a variety of dataline/powerline communication conversion operations that one of skill in the art in possession of the present disclosure would recognize as providing for the transformation of any of a variety of powerline protocol communication data to dataline protocol communication data at block 504d.

As illustrated in FIG. 7D, in an embodiment of block 504d, the powerline networking engine 306b in the power system 306 included in the server device 204a/300 may then operate to perform power transmission operations 712 to transmit the power (e.g., AC power) that was received along with the powerline management communications to the one or more server components 304, and that power may be utilized by those server component(s) 304 for their opreatinos. In addition, the powerline networking engine 306b may also perform dataline management communication transmission operations 714 to transmit the dataline management communications (which were converted from the powerline management communications) to the management engine 308a in the management subsystem 308. Thus, at block 504d, the management engine 308a may receive the dataline management communications, and one of skill in the art in possession of the present disclosure will recognize how the management engine 308a may then perform any of a variety of management operations (e.g., using those dataline management communications, in response to those dataline management communications, etc.) that will fall within the scope of the present disclosure.

Thus, systems and methods have been described that provide a server rack that includes a power distribution system having a switching subsystem coupled to powerline networking engine(s) that are provided with its power connectors and that operate to convert between dataline management communications and powerline management communications, which allows a remote management controller in each of a plurality of server devices to perform management operations via the power cabling that couples those server devices to the power distribution system. For example, embodiments of the power distribution powerline networking management system of the present disclosure may include server devices in server rack, with each of the server devices including a remote management controller, a power system coupled to the remote management controller, and a server powerline networking engine in the power system that is configured to convert between dataline management communications and powerline management communications. The server rack also includes a power distribution system having a respective power connector coupled to the power system in each of the plurality of server devices, a respective power distribution powerline networking engine that is coupled to each respective power connector and that is configured to covert between dataline management communications and powerline management communications, and a switching subsystem that is coupled to each respective power distribution powerline networking engine and that is configured to transmit dataline management communications between the power distribution powerline networking engines and a management system via a network. As such, dataline management communications between the server devices and a network-attached management system are converted by the power distribution system to powerline management communications that may be transmitted via power cabling, thus eliminating the need for network cabling for each of the server devices in order to enable the performance of management operations.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A power distribution powerline networking management system, comprising:
   a server rack;
   at least one data switch device that is located in the server rack and that is connected to a data network;
   a plurality of server devices that are located in the server rack, wherein each of the plurality of server devices includes:
      a data network connection to the at least one switch device that couples that server device to the data network;
      a management subsystem;
      a power system that is coupled to the management subsystem; and
      a server powerline networking engine that is included in the power system and that is configured to convert between dataline management communications and powerline management communications; and
   a power distribution system that is located in the server rack and that includes:
      a chassis;
      a respective power connector that is accessible on the chassis of the power distribution system and coupled to the power system in each of the plurality of server devices;
      a respective power distribution powerline networking engine that is included in the chassis of the power distribution system, that is coupled to each respective power connector, and that is configured to covert between dataline management communications and powerline management communications; and
      a management switching subsystem that is included in the chassis of the power distribution system, that is coupled to each respective power distribution powerline networking engine, that is coupled to a management network, and that is configured to:
         receive first dataline management communications from the management subsystem in each of the plurality of server devices via the respective power distribution powerline networking engines, wherein the first dataline management communications include management system routing information that is configured to route the first dataline management communications to a management system that is coupled to the management network;
         transmit, using the management system routing information, the first dataline management communications to the management system via the management network;
         receive second dataline management communications from the management system via the management network, wherein respective subsets of the second dataline management communications include server device management subsystem routing information that is configured to route those respective subsets of the second dataline management communications to the management subsystem in respective server devices included in the plurality of server devices; and
         transmit, using the server device management subsystem routing information, the respective subsets of the second dataline management communications to the management subsystem in the respective server devices included in the plurality of server devices via the respective power distribution powerline networking engines.

2. The system of claim 1, wherein each server powerline networking engine in each of the plurality of server devices is configured to:
   convert the first dataline management communications received from the management subsystem in that server device to powerline management communications, and transmit those powerline management communications out of the power system in that server device, and wherein each power distribution powerline networking engine coupled to a power connector is configured to:
   covert the powerline management communications received via that power connector to the first dataline management communications, and transmit those first dataline management communications to the management switching subsystem.

3. The system of claim 1, wherein each power distribution powerline networking engine coupled to a power connector is configured to:
   covert the second dataline management communications received from the management switching subsystem to powerline management communications, and transmit those powerline management communications out of that power connector, and wherein each server powerline networking engine in the power system each of the plurality of server devices is configured to:
   convert the powerline management communications received via that power system to one of the respective subsets of the second dataline management communications, and transmit that respective subset of second dataline management communications to the management subsystem in that server device.

4. The system of claim 1, wherein the first dataline management communications and the second dataline management communications include Ethernet management communications.

5. The system of claim 1, wherein the power distribution system is configured to transmit the powerline management communications along with power via each respective power connector to the plurality of server devices.

6. The system of claim 1, wherein the management switching subsystem includes an Ethernet management switch that is integrated in the chassis of the power distribution system.

7. The system of claim 1, wherein the server powerline networking engine included in the power system in each of the plurality of server devices is configured to:

convert powerline management communications received along with power to one of the respective subsets of the second dataline management communications; and provide the power to at least one server component included in that server device.

8. A power distribution system, comprising:

a chassis;

a plurality of power connectors that are accessible on the chassis and that are each configured to couple to a respective computing device that is also coupled via at least one data switch device to a data network;

a respective power distribution powerline networking engine that is included in the chassis and coupled to each of the plurality of power connectors, wherein each respective power distribution powerline networking engine is configured to covert between dataline management communications and powerline management communications; and a management switching subsystem that is included in the chassis, that is coupled to each respective power distribution powerline networking engine, and that is coupled to a management network, wherein the management switching subsystem is configured to:

receive first dataline management communications from a management subsystem in each of the respective computing devices via the respective power distribution powerline networking engines, wherein the first dataline management communications include management system routing information that is configured to route the first dataline management communications to a management system that is coupled to the management network;

transmit, using the management system routing information, the first dataline management communications to the management system via the management network;

receive second dataline management communications from the management system via the management network, wherein respective subsets of the second dataline management communications include computing device management subsystem routing information that is configured to route those respective subsets of the second dataline management communications to the management subsystem in the respective computing devices; and transmit, using the computing device management subsystem routing information, the respective subsets of the second dataline management communications to the management subsystem in the respective computing devices via the respective power distribution powerline networking engines.

9. The power distribution system of claim 8, wherein each power distribution powerline networking engine that is coupled via a power connector to a respective computing device is configured to:

covert powerline management communications received from that computing device via that power connector to the first dataline management communications, and transmit those first dataline management communications to the management switching subsystem.

10. The power distribution system of claim 8, wherein each power distribution powerline networking engine that is coupled via a power connector to a respective computing device is configured to:

covert the second dataline management communications received from the management switching subsystem to powerline management communications, and transmit those powerline management communications out of that power connector to that computing device.

11. The power distribution system of claim 8, wherein the first dataline management communications and the second dataline management communications include Ethernet management communications.

12. The power distribution system of claim 8, wherein each power distribution powerline networking engine that is coupled via a power connector to a respective computing device is configured to:

transmit the powerline management communications along with power via that power connector to that computing device.

13. The power distribution system of claim 8, wherein each of the plurality of power connectors includes an Alternating Current (AC) power plug receptacle.

14. A method for power distribution powerline networking management, comprising:

receiving, by a power distribution system via each of a plurality of power connectors that are accessible on a chassis of the power distribution system and that are each coupled to a respective computing device that is also coupled via at least one data switch device to a data network, first powerline management communications from a management subsystem in each of the respective computing devices;

converting, by a respective power distribution powerline networking engine that is included in the chassis of the power distribution system and that is coupled to each of the plurality of power connectors, the first powerline management communications to first dataline management communications that include management system routing information that is configured to route the first dataline management communications to a management system that is coupled to a management network;

transmitting, by each respective power distribution powerline networking engine to a management switching subsystem that is included in the chassis of the power distribution system and that is coupled to the management network, the first dataline management communications;

transmitting, by the management switching subsystem using the management system routing information and to a management system via the management network, the first dataline management communications;

receiving, by the management switching subsystem from the management system via the management network, second dataline management communications, wherein respective subsets of the second dataline management communications include computing device management subsystem routing information that is configured to route those respective subsets of the second dataline management communications to the management subsystem in the respective computing devices; and transmitting, by the management switching subsystem using the computing device management subsystem routing information and via the respective power distribution powerline networking engines, the respective subsets of the second dataline management communications to the management subsystem in the respective computing devices.

15. The method of claim 14, further comprising:

transmitting, by the management switching subsystem to each of the power distribution powerline networking engines, the second dataline management communications;

converting, by each of the power distribution powerline networking engines, the respective subsets of the second dataline management communications to respective subsets of second powerline management communications; and transmitting, by each of the power distribution powerline networking engines via a respective power connector to a respective computing device, the respective subsets of the second powerline management communications.

16. The method of claim 15, further comprising:

receiving, by each respective computing device via a respective power connector, one of the respective subsets of the second powerline management communications;

converting, by a respective computing device powerline networking engine included in each respective computing device, one of the respective subsets of the second powerline management communications to one of the respective subsets of the second dataline management communications; and transmitting, by the respective computing device powerline networking engine included in each respective computing device to a respective management subsystem in that respective computing device, the one of the respective subsets of the second dataline management communications.

17. The method of claim 15, further comprising:

transmitting, by each of the power distribution powerline networking engines via the respective power connector to the respective computing device, one of the respective subsets of the second powerline management communications along with power.

18. The method of claim 17, further comprising:

converting, by a respective computing device powerline networking engine in each respective computing device, one of the respective subsets of the second powerline management communications that are received along with the power to one of the respective subsets of the second dataline management communications; and providing, by the respective computing device powerline networking engine in each respective computing device, the power to at least one server component included in that respective computing device.

19. The method of claim 14, wherein the first dataline management communications and the second dataline management communications include Ethernet management communications.

20. The method of claim 14, wherein each of the plurality of power connectors includes an Alternating Current (AC) power plug receptacle.

* * * * *